United States Patent [19]

Toda et al.

[11] Patent Number: 5,084,635
[45] Date of Patent: Jan. 28, 1992

[54] FUNCTION SELECTOR CIRCUIT

[75] Inventors: Haruki Toda; Shigeo Ohshima, both of Yokohama; Tatsuo Ikawa, Mitaka, all of Japan

[73] Assignee: Kabushiki Kaisha Toshiba, Kawasaki, Japan

[21] Appl. No.: 588,809

[22] Filed: Sep. 27, 1990

[30] Foreign Application Priority Data

Sep. 29, 1989 [JP] Japan .................................. 1-254668

[51] Int. Cl.⁵ ............................................. H03K 19/00
[52] U.S. Cl. ..................................... 307/465; 307/480; 365/233
[58] Field of Search ............... 307/449, 463, 465, 480; 365/233, 189.02, 189.03

[56] References Cited

U.S. PATENT DOCUMENTS

| | | | |
|---|---|---|---|
| 4,646,269 | 2/1987 | Wang et al. ................ | 365/189.02 X |
| 4,706,217 | 11/1987 | Shimizu et al. ............... | 307/465 X |
| 4,721,868 | 1/1988 | Cornell et al. .................. | 307/465 |
| 4,777,390 | 10/1988 | Hoshi ............................ | 307/463 X |
| 4,910,466 | 3/1990 | Kiuchi et al. ................... | 307/463 X |
| 4,942,319 | 7/1990 | Pickett et al. ................... | 307/465 |
| 4,956,820 | 9/1990 | Hashimoto et al. ............ | 365/233 X |
| 4,970,692 | 11/1990 | Ali et al. ..................... | 365/189.03 X |
| 4,970,693 | 11/1990 | Nozaki et al. ................. | 365/233 X |

*Primary Examiner*—David Hudspeth
*Attorney, Agent, or Firm*—Foley & Lardner

[57] ABSTRACT

A function selection circuit includes a first signal generating circuit for generating a plurality of first signals corresponding to each of all combinations of a plurality of input signal states; and a second signal generating circuit for selecting a plurality of logical sums of combinations of the plurality of first signals and generating a second signal corresponding to each of the plurality of logical sums which selectively activates an operation function indicated by a truth table.

3 Claims, 4 Drawing Sheets

| CAS | DT | WE | DSF=0 | DSF=1 |
|---|---|---|---|---|
| 0 | 0 | 0 | ROP | ROP |
| 0 | 0 | 1 | CBR | CBR |
| 0 | 1 | 0 | ROP | ROP |
| 0 | 1 | 1 | CBR | CBR |
| 1 | 0 | 0 | WT | SWT |
| 1 | 0 | 1 | RT | SRT |
| 1 | 1 | 0 | R/W | FW |
| 1 | 1 | 1 | R/W | LC |

AT FALLING EDGE OF RAS

FIG. 8A PRIOR ART

| CAS | DT | WE | DSF=0 | DSF=1 |
|---|---|---|---|---|
| 0 | 0 | 0 | CBR | SWT |
| 0 | 0 | 1 | CBR | CBR |
| 0 | 1 | 0 | ROP | ROP |
| 0 | 1 | 1 | CBR | CBR |
| 1 | 0 | 0 | WT | FW |
| 1 | 0 | 1 | RT | SRT |
| 1 | 1 | 0 | R/W | R/W |
| 1 | 1 | 1 | R/W | LC |

AT FALLING EDGE OF RAS

FIG. 8B PRIOR ART

FUNCTION SELECTOR CIRCUIT

BACKGROUND OF THE INVENTION

The present invention relates to a function selector circuit for selecting an operation function indicated in a truth table in accordance with a combination of a plurality of input signal states, particularly to a function selector circuit used with a dual port video RAM having a number of operation functions.

As is often the case for a memory having a number of operation functions such as a dual port video RAM (hereinafter called DPRAM) used in recording and processing image data, a truth table for defining the correspondence between a plurality of external input signal states and a plurality of operation functions is used differently for each particular application and is not standardized. Even if it is attempted to standardize a truth table, this requires a number of modifications and much time. Two examples of such a conventional truth table are shown in FIGS. 8A and 8B. Symbols ROP, CBR, WT, SWT, RT, SRT, R/W, FW, and LC used in these truth tables indicate the following operation functions. Namely, ROP: Raster Operation, CBR: CAS Before RAS Refresh, WT: Write Transfer, SWT: Split Write Transfer, R/T: Read Transfer, SRT: Split Read Transfer, R/W: Normal Read/Write, FW: Flash Write, and LC: Load Color Register. The contents of these operation functions are not directly related to the gist of this invention, so the description therefor is omitted. Various operation functions correspond to various areas of a truth table. Each operation function in a truth table is determined in accordance with the states of external signals $\overline{RAS}$, $\overline{CAS}$, $\overline{DT}$, $\overline{WT}$ and DSF, and there are sixteen types of operation functions which are determined by the states of $\overline{CAS}$, $\overline{DT}$, $\overline{WE}$ and DSF at the falling edge of RAS. The allocations of operation functions are different between the truth tables shown in FIGS. 8A and 8B so that circuit designs must be changed depending upon which truth table is used. Conventionally, after a truth table and specification are determined, circuit designs start for the manufacture of final devices.

Thus, a change in a truth table during or after circuit designs results in a change in circuits, which is difficult to carry out in the practical sense. It is therefore important to decide which truth table is to be used as the final target.

SUMMARY OF THE INVENTION

It is an object of the present invention to provide a function selector circuit capable of starting circuit designs even if a truth table and specification are not still definitely determined and are likely to have future change, and capable of dealing with changes in a truth table after circuit design at the stage of manufacturing.

According to the function selector circuit of this invention, a first signal generating means generates a plurality of first signals corresponding to each of all combinations of a plurality of input signal states. A second signal generating means selects a plurality of logical sums of combinations of said plurality of first signals and generates a second signal corresponding to each of said plurality of logical sums which selectively activates an operation function indicated by a truth table. With this arrangement, even if the truth table or specification is not still definitely determined, circuit designs can be started, and even if a truth table is changed after circuit designs, such a change can be dealt with at the stage of the manufacturing process.

BRIEF DESCRIPTION OF THE DRAWINGS

In the accompanying drawings,

FIGS. 8A and 8B show examples of a truth table.

DESCRIPTION OF THE PREFERRED EMBODIMENT

Figures 1, 2:
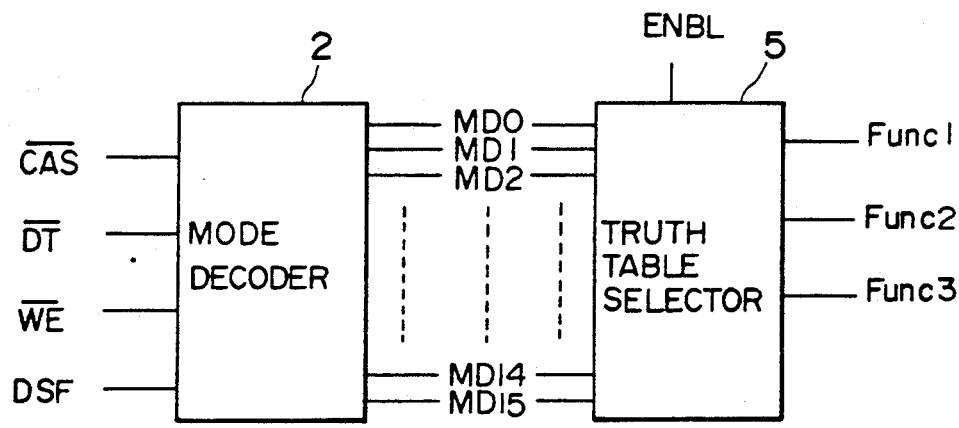
FIG. 1 is a block diagram showing an embodiment of the function selector circuit according to this invention.
FIG. 2 shows a table showing the allocation of signals MD0, . . . , MD15 in a truth table.

An embodiment of the function selector circuit of this invention is shown in FIG. 1. The embodiment function selector circuit is constructed of a mode decoder 2 and a truth table selector circuit 5, and is used with DPRAM. The mode decoder 2 produces signals MD0, MD1, . . . , MD15 for indicating the positions of a truth table as shown in FIG. 2, in accordance with each of all combinations of the states ("0" or "1") of input signals $\overline{CAS}$, $\overline{DT}$, $\overline{WE}$ and DSF. These signals MDi (i=0, . . . , 15) correspond to each of the input signal states at the falling edge of an input control signal $\overline{RAS}$. This is distinctively different from a conventional circuit in which operation function signals are directly related to each truth table shown in FIGS. 8A and 8B.

Figure 3:
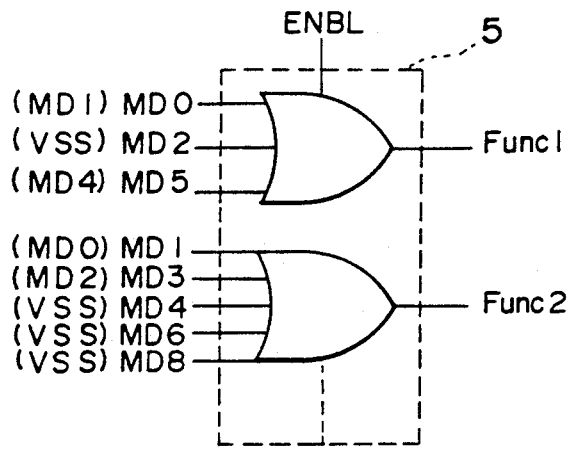
FIG. 3 is a block diagram showing an example of the truth table selector circuit shown in FIG. 1.

The truth table selector circuit 5 generates signals Func1, Func2, . . . for selecting an operation function in accordance with the signal MDi (i=0, . . . , 15) while being controlled by an output control signal ENBL. How the truth table selector circuit 5 generates signals Func1, Func2, . . . in accordance with the signal MDi (i=0, ..., 15) is illustrated in FIG. 3 by way of example. In the example shown in FIG. 3, there are provided two truth tables. The signal Func1 corresponds on one hand to the position MD1 and MD4 of the truth table shown in FIG. 2, and on the other hand to the positions MD0, MD2 and MD5. An output of an OR gate by these signals is used as the output signal Func1, the input thereof being selectively connected to one of the two types of truth tables. The signal Func2 corresponds on one hand to the positions MD0 and MD2 of the truth table, and on the other hand to the positions MD1, MD3, MD4, MD6 and MD8. An output of an OR gate by these signals is used as the output signal Func2, the input thereof being selectively connected to one of the two types of truth tables. Signals Func1, Func2 and so on are output when a signal ENBL is supplied.

The structure of the above circuits will be described in more detail below.

Figure 4:
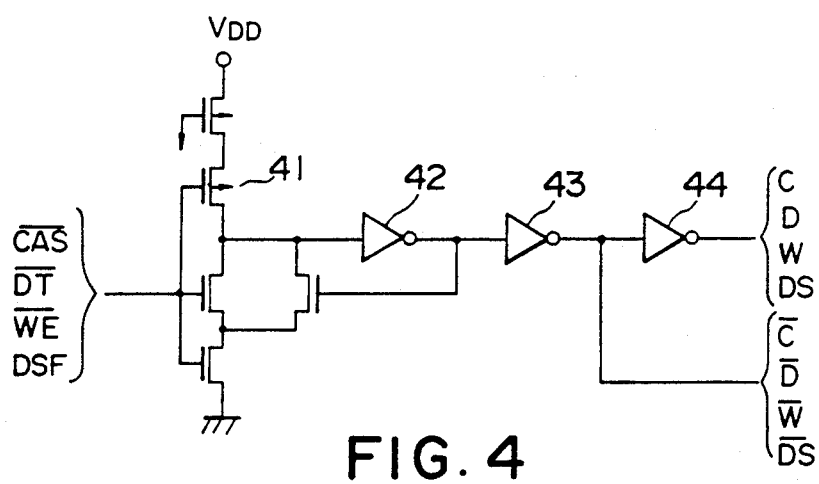
FIG. 4 is a circuit diagram of an input level converter circuit constituting a circuit element of the mode decoder shown in FIG. 1.

A signal level converter buffer circuit for converting control input signals of the mode decoder 2 is shown in FIG. 4. In FIG. 4, mode control signals of a TTL level including $\overline{CAS}$, $\overline{DT}$, $\overline{WE}$ and DSF are converted into a CMOS level by the level converter circuit 41, and thereafter they pass through inverters 42 to 44 and are outputted as complementary internal signals C, $\overline{C}$, D, $\overline{D}$, W, $\overline{W}$, and DS, $\overline{DS}$.

Figure 5:
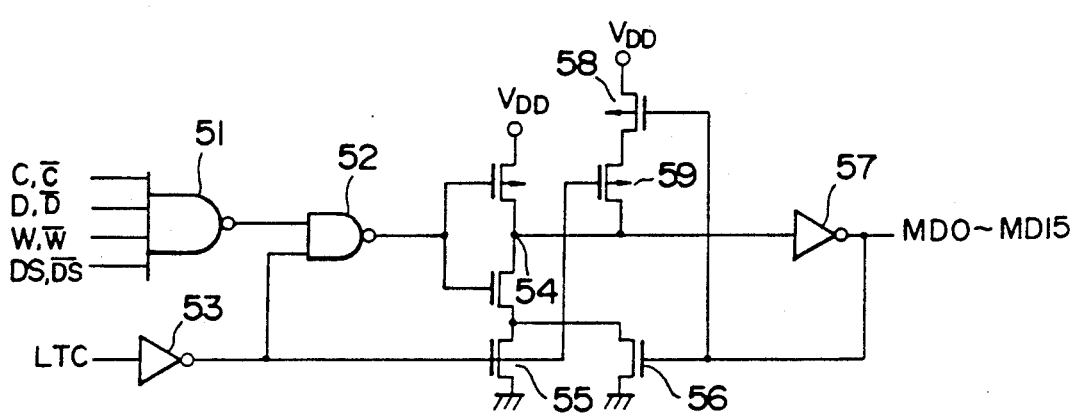
FIG. 5 is a circuit diagram showing another circuit element of the mode decoder shown in FIG. 1.

The circuit comprising the mode decoder 2 in connection with the signal level converter buffer circuit for decoding the mode control signals is shown in FIG. 5. The mode decoder 2 for generating signals MD0, MD1, ... has sixteen circuits, one of which is shown in FIG. 5, corresponding in number to the number of combinations of the internal signals (C, $\overline{C}$), (D, $\overline{D}$), (W, $\overline{W}$) and (DS, $\overline{DS}$). These internal signals are input to an NAND gate 51 whose output is supplied to one input of an NAND gate 52. A latch signal LTC is supplied to an inverter 53 whose output is supplied to the other input of the NAND gate 52. The output of the NAND gate 52 is input to a CMOS inverter 54. On the ground side of the inverter 54, there are connected N-channel MOS transistors 55 and 56 in parallel. The MOS transistor 55 has its gate coupled to the output of the inverter 53. The output of the CMOS inverter 54 is input to an inverter 57 whose output MD0, MD1, ..., MD15 is coupled to the gate of the MOS transistor 56. Between the power source $V_{DD}$ and the output terminal of the CMOS inverter 54, there is connected a serial circuit of P-channel MOS transistors 58 and 59 the gates of which are connected to the outputs of the inverters 57 and 53, respectively.

In the circuit shown in FIG. 5, the latch signal LTC takes "1" level at the falling edge of $\overline{RAS}$. If the latch signal LTC takes "0" level, the "1" level of the output of the inverter 53 causes the MOS transistor 55 to turn on and the MOS transistor 59 to turn off. In this case, an output signal MD0, MD1, ... is determined by the combination of levels of the four input signals. If the latch signal LTC is "1", output MD0, MD1, ... at that time is latched and the output will not change so long as the latch signal LTC is "1". Specifically, if an output MD0 is "0" and the latch signal LTC becomes "1", the output "0" of the inverter 53 causes the transistor 59 to turn on and the transistor 55 to turn off, and the output "0" of MD0 causes the transistor 58 to turn on and the transistor 56 to turn off. As a result, the potential at the input terminal of the inverter 57 is latched to a pull-up state by the on-state transistors 58 and 59. On the contrary, if an output MD0 is "1" and the latch signal LTC becomes "1", the output "0" of the inverter 53 causes the transistor 59 on turn on and the transistor 55 to turn off, and the output "1" of MD0 causes the transistor 56 to turn on and the transistor 58 to turn off. As a result, the potential at the input terminal of the inverter 57 is latched to a pull-down state by the N-channel transistor (on-state) of the CMOS inverter 54 and the on-state transistor 56.

Thus, the level of MD0, MD1, ... is determined in accordance with the combinations (maximum 16) of levels of $\overline{CAS}$, $\overline{DT}$, $\overline{WE}$ and DSF at the falling edge of $\overline{RAS}$. The truth table of the circuit shown in FIG. 5 corresponds to the table shown in FIG. 2.

The correspondence between the outputs MD0, MD1, ..., MD15 and the actual operation modes is determined in accordance with the specification of integrated circuits. According to the embodiment, this correspondence can be determined by an optional combination of outputs MD0, MD1, ..., MD15, which is realized by the truth table selector circuit 5, the examples of which are shown in FIGS. 6 and 7.

Figure 6:
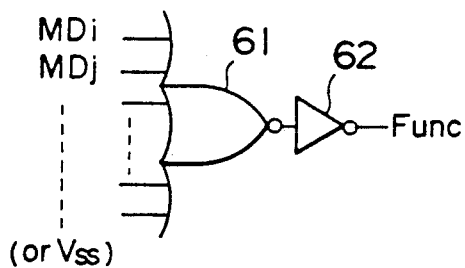
FIG. 6 and 7 are concrete circuit diagrams of the truth table selector circuit.
Figure 7:
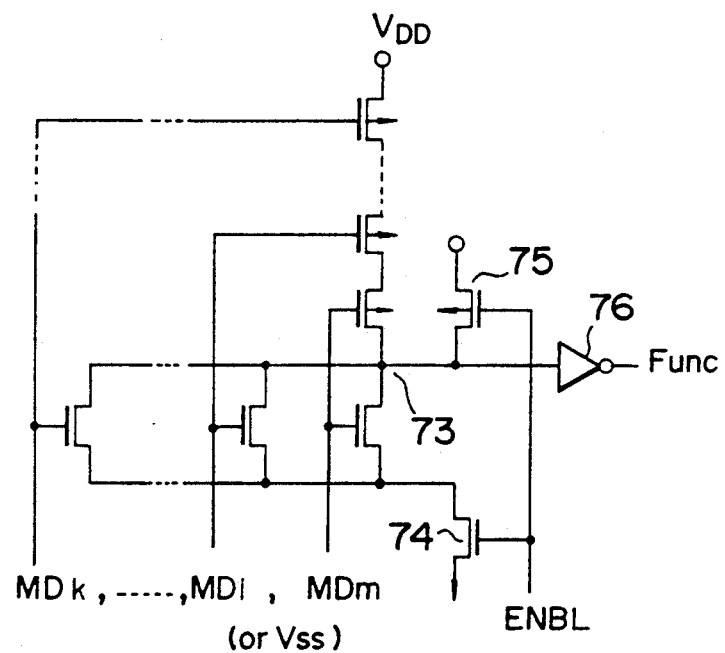

The difference between FIGS. 6 and 7 resides in that the circuit shown in FIG. 6 changes its output in accordance with the state of MD0, ... whereas the circuit shown in FIG. 7 operates in a manner similar to the circuit shown in FIG. 6 only when the internal control signal ENBL is "1" and takes a value "0" when the signal ENBL is "0" irrespective of the state of MD0, .... Specifically, in the circuit shown in FIG. 6, a NOR gate 61 is provided which has the number of inputs same as that of the allowable positions of a truth table for output signals Func and has an output connected to an inverter 62. The output of the inverter 62 is a signal Func by which a certain operation mode is initiated. In FIG. 6, the inputs of the NOR gate 61 are indicated by MDi, MDj, ... If the number of input nodes is larger than the number of positions of a truth table, excessive input nodes are connected to the ground potential $V_{SS}$.

In the circuit shown in FIG. 7, in order to inhibit any operation mode before the signal ENBL rises up, the circuit is arranged to operate only when the signal ENBL takes "1". Specifically, signals MDk, MDl, MDm, ... indicating the positions of a truth table are inputted to an NOR gate 73. The NOR gate 73 has an N-channel switching transistor 74 connected at the ground terminal side, and an inverter 76 and a P-channel pull-up transistor 75 at the output side. The gates of the transistors 74 and 75 are supplied with the signal ENBL. As the signal ENBL becomes "0", the transistor 74 turns off and the transistor 75 turns on so that the potential at the input terminal of the inverter 76 becomes "1" and the output Func becomes "0". As the signal ENBL becomes "1", the transistor 74 turns on and the transistor 75 turns off. Therefore, the output of the NOR gate 73 is inverted by the inverter 76 and a logical OR output Func of the input signals MDk, MDl, MDm, ... is obtained. In FIG. 7, the inputs of the NOR gate 73 are indicated by MDk, MDl, ... If the number of input nodes is larger than the number of positions of a truth table, excessive input nodes are connected to the ground potential $V_{SS}$.

As described previously, according to the embodiment, signals MD0, MD1 ... MD15 indicating the position of truth tables are first produced. The logical OR output of these signals is used for producing an operation function select signal by the circuit such as shown in FIGS. 6 and 7 in accordance with a suitable truth table. In this regard, by suitably selecting inputs to the NOR gate 61 of FIG. 6 or NOR gate 73 of FIG. 7, any specification of a truth table can be readily realized. A change of inputs may be made through metalization at the final stage of the IC manufacturing processes.

What is claimed is:

1. A function selection circuit comprising:
    first signal generating means for generating a plurality of first signals each corresponding to each of all combinations of a plurality of input signal states; and
    second signal generating means for selecting a plurality of logical sums of combinations of said plurality of first signals and generating a second signal corresponding to each of said plurality of logical sums which selectively activates an operation function indicated by a truth table, said truth table indicating the relationship between the combinations of said plurality of input signal states and various operation functions;
    whereby an operation function indicated by said truth table and corresponding to each of the combinations of said plurality of input signal states is selected, in accordance with said truth table.

2. A function selector circuit according to claim 1, wherein said first signal generating means latches a signal state of input signals at a predetermined timing, and generates said first signal corresponding to the combination of latched signal states.

3. A function selector circuit according to claim 1, wherein said second signal generator outputs a logical sum of the state of said first signals during a predetermined period, and becomes disabled during periods other than said predetermined period.

* * * * *